United States Patent [19]
van Mil et al.

[11] Patent Number: 5,140,282
[45] Date of Patent: Aug. 18, 1992

[54] CURRENT AMPLIFIER ARRANGEMENT

[75] Inventors: Job F. P. van Mil; Martinus P. M. Bierhoff, both of Eindhoven, Netherlands

[73] Assignee: U.S. Philips Corporation, New York, N.Y.

[21] Appl. No.: 681,233

[22] Filed: Apr. 5, 1991

[30] Foreign Application Priority Data

Apr. 27, 1990 [NL] Netherlands .................. 9001015

[51] Int. Cl.$^5$ .............................................. H03F 3/26
[52] U.S. Cl. ...................................... 330/267; 330/288
[58] Field of Search ................. 307/246.1; 323/315, 323/316; 330/263, 265, 267, 268, 288, 296, 264

[56] References Cited

U.S. PATENT DOCUMENTS 3,852,678 12/1974 Frye ............................... 330/265
4,394,625 7/1983 Sakai ............................. 330/267

*Primary Examiner*—Steven Mottola
*Attorney, Agent, or Firm*—Bernard Franzblau

[57] ABSTRACT

A current amplifier arrangement in which a current-current converter (30) has an input connected to the input (33) of the current amplifier arrangement and a power supply input (34, 35) to which a current source (51-54) is connected a current mirror circuit (31, 32, 42, 44)has an input connected to the output (36-39) current converter and an output (46-49) connected to the output (50) of the current amplifier arrangement. The current converter includes a first output transistor (T1, T3) whose main current path is arranged between the input (33) and the output (37, 39) of the converter and whose base is connected to the power supply input (34, 36), and a diode-connected driver transistor (T2, T4) connected between the base of the first output transistor (T1, T3) and a node (K) which provides a reference potential during operation. The main current path of a second output transistor (T5, T6) is connected to the output of the arrangement and the base of this transistor is connected to said node. The driver transistor conducts as long as a part of the current supplied by the current source flows through the driver transistor and thereby keeps the second output transistor cut off. When the full current from the current source flows through the base of the first output transistor, the second output transistor can be turned on because the driver transistor is then not conductive. Then the second output transistor can also supply current to the output of the amplifier.

14 Claims, 5 Drawing Sheets

CURRENT AMPLIFIER ARRANGEMENT

BACKGROUND OF THE INVENTION

This invention relates to a current amplifier arrangement comprising a current-current converter having an input connected to an input of the current amplifier arrangement, an output, and a power supply input to which a current source is connected, which current-current converter comprises an output transistor whose main current path is connected between the input and the output of the current-current converter and whose base is connected to the power supply input, and a diode-connected driver transistor connected between the base of the output transistor and a node carrying a reference potential during operation, a current mirror circuit having an input connected to the output of the current-current converter and having an output connected to the output of the current amplifier arrangement.

Such a current amplifier arrangement is known, inter alia, from U.S. Pat. No. 4,803,441, in particular FIG. 6. The amplifier stage shown therein in fact comprises two such arrangements, one arrangement being connected to the positive supply voltage terminal for supplying a current of one polarity to the output and the other arrangement being connected to the negative supply voltage terminal for supplying a current of opposite polarity to the output. The combination of the two current-current converters has the advantage that the cross-over from the current of one polarity to the current of the other polarity at the output is effected in accordance with a linear characteristic.

Depending on the polarity of the input current, one of the current-current converters supplies a current to the associated current mirror circuit, which "reproduces" and outputs this current. If an accurate current mirror ratio is to be achieved for a large current range this will require the use of an accurate current mirror circuit. However, such accurate current mirror circuits are intricate and/or comprise so many transistors in series between the supply voltage terminal and the output of the amplifier arrangement that the voltage drop across them does not fit in the available supply voltage range. In such a case there will be no other choice than to revert to a current mirror circuit of a simpler type, which reduces the voltage drop across the current mirror circuit but often at the expense of the accuracy.

The inaccuracy of simple current mirror circuits is generally caused by the spread in transistor characteristics (gain, maximum current, substrate leakage current, and the like). It is known to reduce the effect of transistor spreads in such simple current mirror circuits by arranging resistors in series with the emitters of the transistors situated in the path between the supply voltage terminal and the output of the amplifier arrangement. These linearizing resistors reduce the influence of the base-emitter voltage of the transistors on the current mirror characteristics of the current mirror circuit. The values of the emitter resistors can be computed on the basis of the envisaged maximum current level through the current mirror circuit because the voltage drop across the current mirror circuit is maximal for this maximum current level. However, this means that the influence of the resistance thus computed is hardly noticeable at low current levels because the voltage drop across the resistance is then negligible relative to the base-emitter voltage. For smaller current levels such a simple current mirror circuit comprising linearizing resistors therefore has a poorer performance.

On account of the above problem it is difficult to achieve a fairly accurate current mirror ratio (unity or another constant ratio) over a wide current range by means of the known simple current mirror circuits. This applies in particular to current mirror circuits comprising PNP transistors.

SUMMARY OF THE INVENTION

It is an object of the invention to provide a solution to this problem, i.e. to indicate how a current amplifier arrangement can be realised by means of current mirror circuits which maintain an accurate current mirror ratio over a large current range.

In a current amplifier arrangement of the type defined in the opening paragraph, this is achieved in that the current-current converter comprises a second output transistor having its main current path arranged between the input and an output of the current-current converter and having its base connected to said node, the driver transistor being conductive as long as a part of the current supplied by the current source flows through the driver transistor and thereby keeps the second output transistor cut off, and when the full current from the current source flows through the base of the first output transistor the second output transistor can become conductive, because the driver transistor is then cut off, and can also supply current to the output of the current-current converter.

A first preferred embodiment of the current amplifier arrangement in accordance with the invention is characterized in that the main current path of the second output transistor has an end connected to a supply voltage terminal of the current amplifier arrangement.

A second preferred embodiment of the current amplifier arrangement in accordance with the invention is characterized in that the main current path of the second output transistor has an end connected to the input of a second current mirror circuit having an output connected to the output of the current amplifier arrangement.

In accordance with the invention the output current range of the amplifier is divided into a plurality of sub-ranges and for each sub-range use is made of a separate current mirror circuit adapted to its sub-range, the currents supplied by the various current mirror circuits being summed at the output. The various sub-ranges are defined by limiting the current to be supplied by each current mirror circuit to a value dictated by the current-current converter. The various output transistors in the converter, which each belong to a separate current sub-range, are therefore connected to one common node, either via the diode-connected driver transistor as in the case of the first output transistor, or directly as in the case of the second output transistor. Thus, it is achieved that below a specific current level, which depends on the maximum current that can be delivered by the current source and on the gain factor of the first output transistor, current is supplied only via the first current mirror circuit, and that above said output current level the current through the first current mirror circuit remains constant and a further current is supplied via the second output transistor. This further current may be provided by a further current mirror circuit, which can be of simpler construction than the first-mentioned current mirror circuit, or it can be taken directly from a power supply circuit. The last-mentioned case may be regarded as an extremely simplified current mirror circuit.

BRIEF DESCRIPTION OF THE DRAWINGS

The invention will now be described in more detail, by way of example, with reference to the accompanying drawing in which.

DESCRIPTION OF THE PREFERRED EMBODIMENTS

Figure 1:
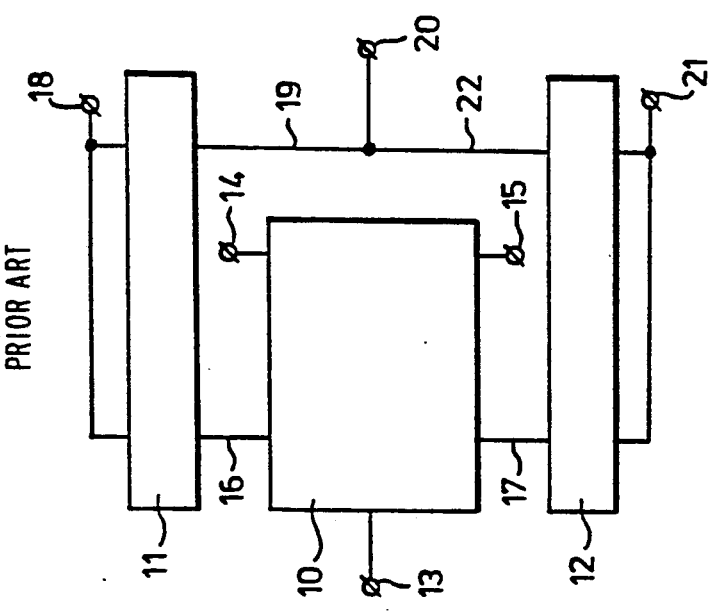
FIG. 1 is a block diagram of a prior-art arrangement.

FIG. 1 is a block diagram showing the arrangement known from U.S. Pat. No. 4,803,441. This arrangement comprises the current-current converter 10, which receives a positive supply voltage +V via a terminal 14 and a negative supply voltage −V via a terminal 15. The input current $I_{in}$ is applied via the input 13 and, depending on the polarity of this input current, an output current is supplied to a current mirror circuit 11 via the line 16 or to a current mirror circuit 12 via the line 17. The current mirror circuit 11 receives a positive supply voltage via the terminal 18 and the current mirror circuit 12 is energized with a negative supply voltage via the terminal 21. Both current mirror circuits 11 and 12 may be constructed for 1:1 transmission of the current from the input line 16 to the output line 19 or from the input line 17 to the output line 22, or they may be constructed in such a way that a 1:n transmission is obtained, n being dependent upon the configuration of the relevant current mirror circuit. The output lines 19 and 22 are both connected to the output 20 of the circuit, on which output the output current becomes available. For further details on the operation of this prior-art arrangement, reference is made to said U.S. Pat. No. 4,803,441.

Figure 2:
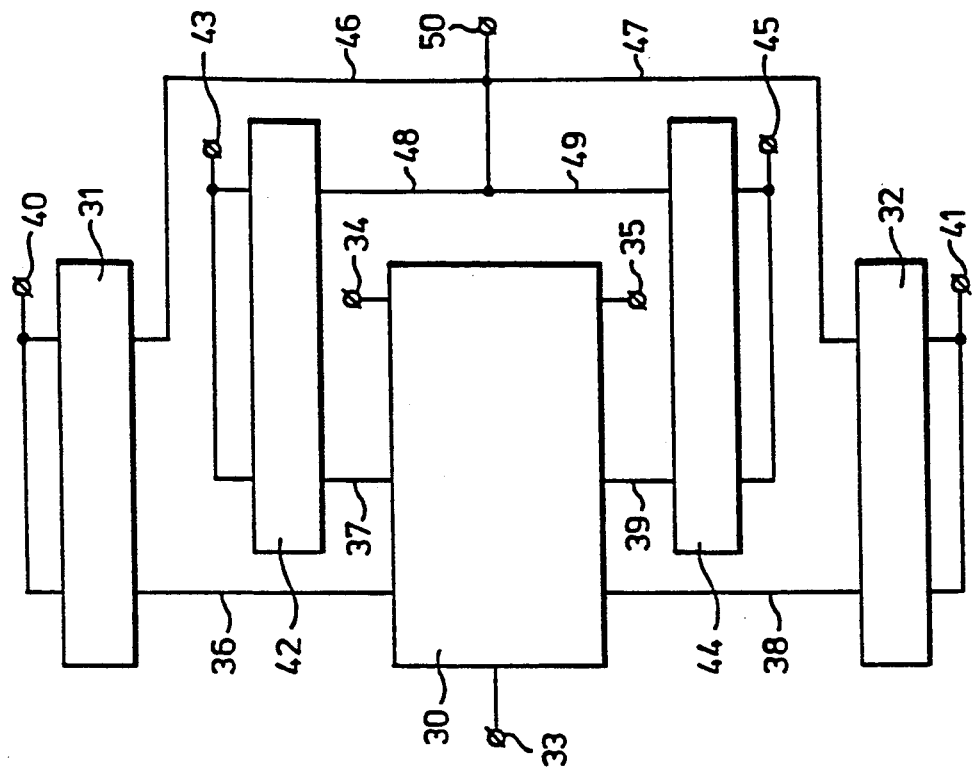
FIG. 2 is a block diagram of an arrangement in accordance with the invention.

FIG. 2 shows a block diagram of an arrangement in accordance with the invention. The arrangement comprises a current-current converter 30, which receives a positive supply voltage via a terminal 34 and which receives a negative supply voltage via a terminal 35. The input current is applied via the terminal 33. Depending upon the polarity of the input current and depending upon the amplitude of the input current the converter 30 supplies an output current to one or more of the four outputs 36, 37, 38 or 39. The output line 36 is connected to the input of a current mirror circuit 31, which receives a positive supply voltage via a terminal 40. The output line 38 is connected to the input of a current mirror circuit 32, which receives a negative supply voltage via a terminal 41. The output line 37 is connected to the input of a current mirror circuit 42, which receives a positive supply voltage via a terminal 43, and the output 39 is connected to the input of a current mirror circuit 44, which receives a negative supply voltage via a terminal 45. The output lines of the current mirror circuits 31, 32, 42 and 44, bearing the reference numerals 46, 47, 48 and 49, respectively, are commoned at the output 50 of the current amplifier arrangement.

If a current of a first polarity is applied to the input 33, which current is to be transmitted to the output 50 via a current mirror circuit connected to a positive supply voltage, the amplitude of this current dictates which of the current mirror circuits 31 or 42 in the arrangement in accordance with the invention shown in FIG. 2 is activated. If the amplitude of the input current is smaller than a predetermined threshold value, which is detected in the converter 30, an output current will be supplied only to the current mirror circuit 31 via the line 36. However, if the amplitude of the input current is higher than said threshold value, the converter 30 will limit the current via the line 36 to the current mirror 31 to a fixed value and will also supply a current to the current mirror 42 via the output 37. A similar process is obtained for input currents of opposite polarity. If the amplitude of an input current of opposite polarity is smaller than a predetermined threshold value, the converter 30 will only supply a current to the current mirror circuit 32 via the output line 38, and in the case of an input current of opposite polarity and of an amplitude higher than said threshold value the converter will limit the current via the line 38 to the current mirror 31 to a fixed value and will also supply a current to the current mirror circuit 44 via the output 39.

The manner in which the converter 30 operates and in particular the manner in which current division is effected in this converter will be described in detail with reference to FIGS. 3 and 4.

Figure 3:
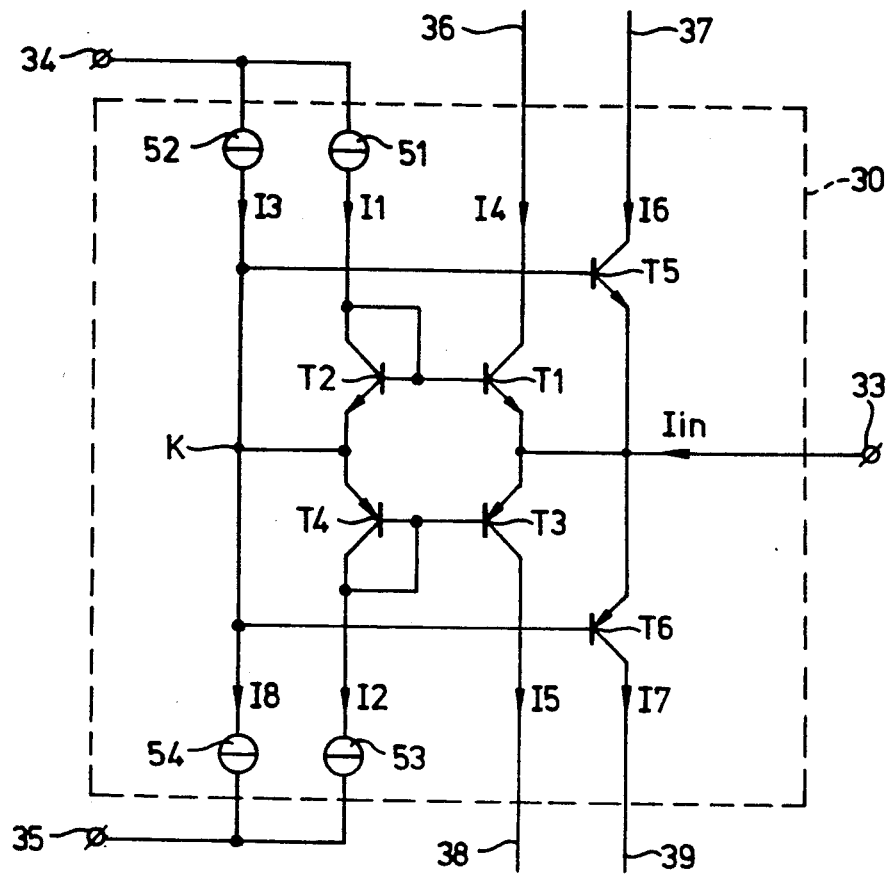
FIG. 3 shows in greater detail the current-current converter employed in the arrangement shown in FIG. 2.
Figure 4:
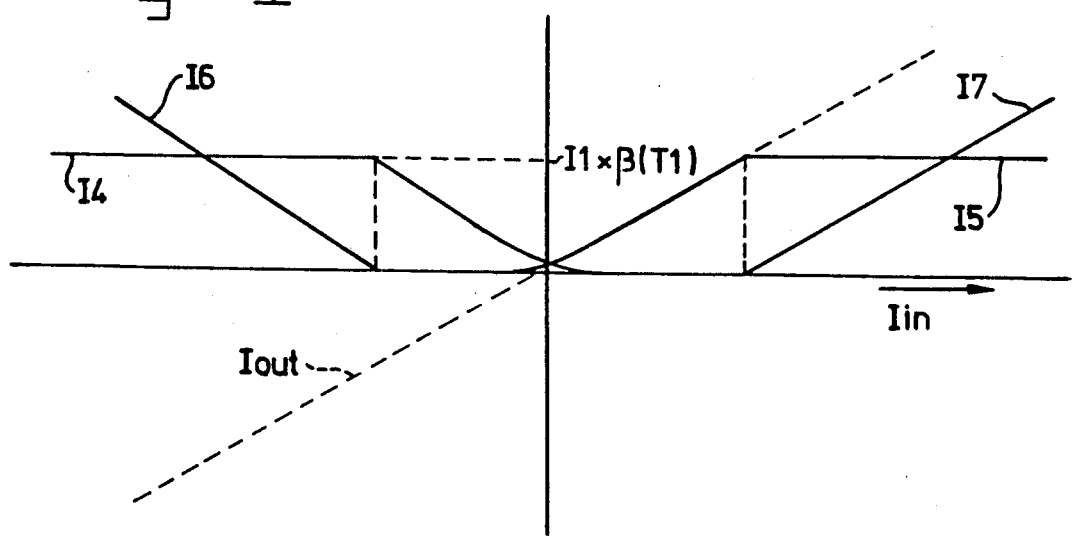
FIG. 4 is a diagram of some currents appearing in the converter shown in FIG. 3.

FIG. 3 shows diagrammatically an example of the converter 30, and FIG. 4 shows a current diagram to illustrate the operation of the arrangement shown in FIG. 3. FIG. 3 shows the current-current converter 30 of FIG. 2 in more detail. The converter 30 comprises a transistor T1 whose main current path is arranged between the input 33 and the output line 36 in the manner as shown. The base of T1 is connected to the base of a diode-connected transistor T2 and is also connected to the current source 51. Moreover, the diode-connected transistor T2 is connected to the node K. The main current path of a transistor T5 is arranged between the input 33 and the output line 37, and the base of this transistor T5 is connected both to the current source 52 and to the node K.

At the negative side of the current converter the transistors T3, T4 and T6 are arranged in a mirror-inverted configuration. The main current path of T3 is arranged between the input 33 and the output line 38, and the base of T3 is connected to a diode-connected transistor T4 and to the current source 53. The other terminal of T4 is connected to the node K. The main current path of the transistor T6 is arranged between the input 33 and the output line 39, and the base of T6 is connected both to the current source 54 and to the node K. The current sources 51 and 52 are connected to the supply terminal 34 on which a positive supply voltage is available during operation, and the current sources 53 and 54 are connected to the supply terminal 35, on which a negative supply voltage is available during operation.

For the description of the operation of the circuit 30 shown in FIG. 3 reference is made to the current diagram shown in FIG. 4. When it is assumed that there is a comparatively small input current $I_{in}$ in a negative sense (from the circuit 30 to the input 33), this current will be supplied by the transistor T1, which for this purpose receives a base current from the current source 51. The current I1 supplied by the current source 51 is partly applied to the base of T1 and partly flows through the main current path of T2. The combination of the base-emitter voltage of T1 and the base-emitter voltage of T2 ensures that the voltage drop between the input 33 and the node K, which voltage drop is equal to the base-emitter voltage of T5, is small enough to keep T5 in the non-conductive state.

If the current $I_{in}$ increases a situation will be reached in which the full current I1, supplied by the current source 51, flows through the base of T1. At this instant the output current I4 flowing through the output line 36 is equal to $I1 \times \beta(T1)$. The current source 51 then supplies the maximum current to the base of the transistor T1 and, in fact, the output current I4 of this transistor cannot increase any further. This is also apparent from FIG. 4, which shows that when this situation is reached the current I4 is limited to a fixed value. As the full current from the current source 51 now flows through the base of T1 and as T2 no longer receives any current, T2 will pass from the conductive to the non-conductive state. As a result of this, the voltage drop across T2 increases and, consequently, the base-emitter voltage of T5 can increase, enabling T5 to be turned on, so that in addition to the current I4 a current I6 can flow via the output line 37. Consequently, this current I6 starts to flow at the instant at which the current I4 is stabilized at its maximum value, as is apparent from FIG. 4. The base current required for T5 is furnished by the current source 52, which can supply a maximum current I3.

As appears from FIG. 2, the current I4 is applied to the output 50 via the output 36 and the current mirror circuit 31, and the current I6 is applied to the output 50 via the output 37 and the current mirror circuit 42. When it is assumed that both current mirror circuits 31 and 42 have a unity transmission ratio, the output current $I_{out}$ will comprise the sum of the currents I4 and I6, which sum is represented by $I_{out}$ in FIG. 4.

If the current $I_{in}$ flows in a positive direction (from the input 33 inwards) the lower section of the current converter 30, which section comprises the transistors T3, T4 and T6, becomes operative. If the current is comparatively small an output current I5 will be supplied to the output 38 via the transistor T3. The transistor T3 receives a base current from the current source 53. The current I2 supplied by the current source 53 flows partly through the base of T3. As long as T3 does not yet supply the maximum current I5, a part of I2 also flows through the main current path of the diode-connected transistor T4. In this situation the combination of the base-emitter voltage of T3 and the base-emitter voltage of T4 will ensure that the voltage drop between the input 33 and the node K, which voltage drop is equal to the base-emitter voltage of T6, is too small to turn on T6. If the point is reached at which the full current I2 flows through the base of T3, from which point the current I5 is limited to its maximum value, as is apparent from FIG. 4, the base-emitter voltage of T6 will change in such a way as a result of the cut-off of T4 that T6 can be turned on. From this instant a current I7 can flow via the output line 39 in a manner as illustrated in FIG. 4. The base current for T6 is derived from the current source 54, which supplies the current I8. If it is assumed again that the current mirror circuits 32 and 44, which feed the currents to the outputs 38 and 39 respectively, have a unity transmission ratio, the output current $I_{out}$ for a positive $I_{in}$ will be as illustrated in FIG. 4 for positive input currents.

If a circuit of the type as illustrated in FIG. 3 is employed as an output stage in an operational amplifier, at least one of the current sources 52 or 54 must be constructed as a variable current source. In the simplest case the current source 54 may be constructed, for example, by means of a transistor whose main current path is arranged between the node K and the supply voltage terminal 35, the base terminal serving as the control terminal for the current amplifier arrangement, which terminal can receive a signal from the preceding operational amplifier circuit during operation.

Figure 5:
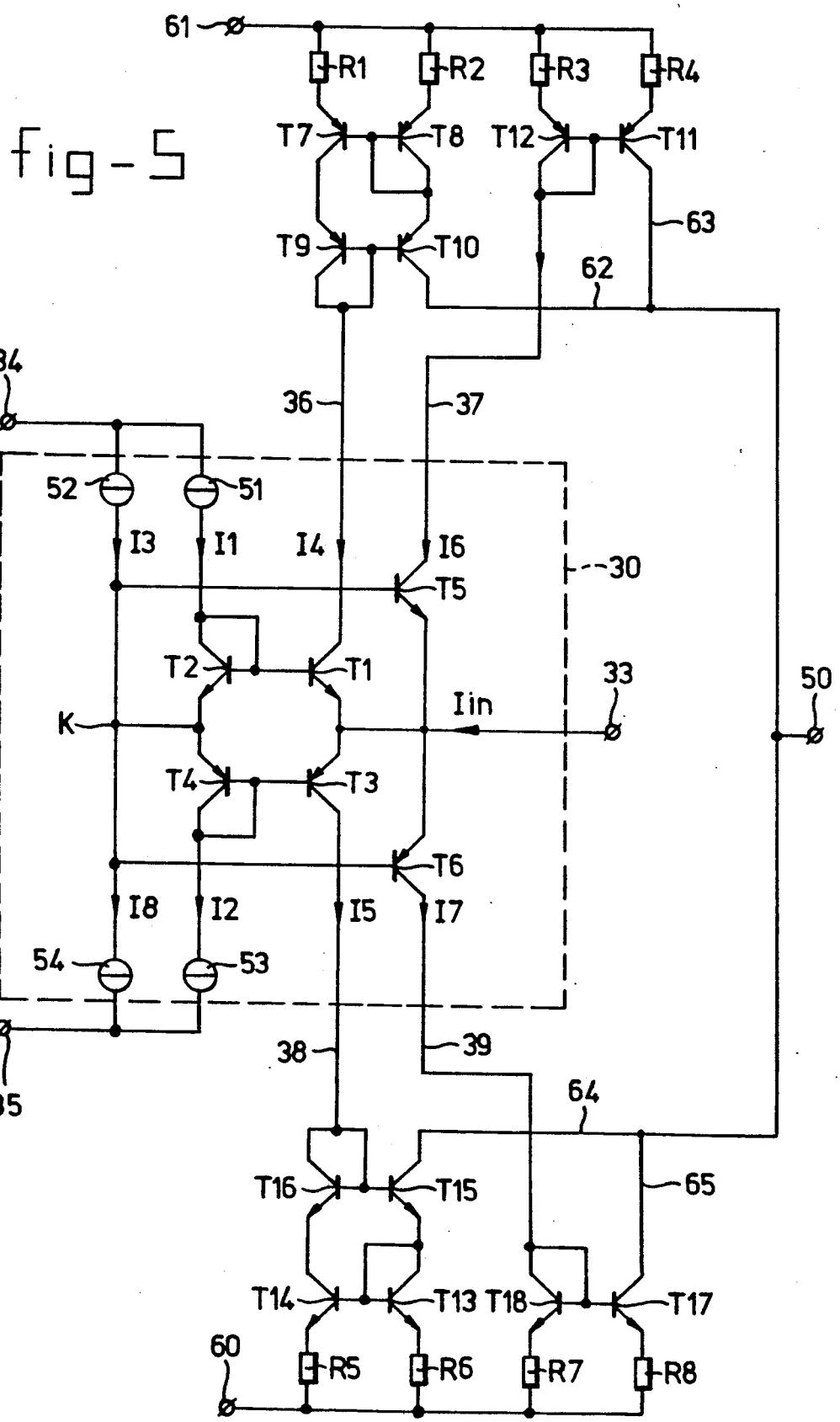
FIG. 5 shows the block diagram of FIG. 2 in greater detail.

FIG. 5 shows in greater detail an example of a current amplifier arrangement in accordance with the invention. The current-to-current converter 30 shown in detail in FIG. 3 is now shown in the center of FIG. 5. In the same way as in FIG. 3 the current-current converter 30 comprises the transistors T1 through T6 and the current sources 51 through 54.

The output line 36 of the current converter is connected to a current mirror circuit comprising the transistors T7 through T10 and the linearizing resistors R1 and R2. This current mirror circuit is energized from the power supply terminal 61, on which a positive voltage is available, and reproduces and feeds the current on the input line 36 to the output line 62, which is connected to the output 50. The operation of this current mirror circuit is known to those skilled in the art and will therefore not be described in further detail.

The output line 37 is connected to a further current mirror circuit of a much simpler type, comprising the resistors R3 and R4 and the transistors T11 and T12. This further current mirror circuit is also energized via the supply voltage terminal 61. This further current mirror circuit reproduces and feeds the current on the input line 37 to the output line 63, which is connected to the output 50 of the circuit.

The output line 38 of the current converter is connected to a current mirror circuit comprising the transistors T13 through T16 and the resistors R5 and R6. This current mirror circuit, which is energized with a negative voltage via the supply voltage terminal 60 reproduces and feeds the current on the line 38 to the output line 64, which is connected to the output 50.

The output line 39 of the current converter is connected to a simpler current mirror circuit comprising the transistors T17, T18 and the resistors R7, R8. This current mirror circuit is also energized via the supply voltage terminal 60. This simple current mirror circuit reproduces the current on the line 39 to feed it to the line 65, which is connected to the output 50.

After the description with reference to FIG. 3, it will be evident that in the arrangement shown in FIG. 5 the comparatively more accurate current mirror circuits (comprising the transistors T7 ... T10 and T13 ... T16 respectively) are used for generating an output current as long as the input current has a comparatively small value below a specific threshold value. If this threshold value is exceeded the comparatively simple and less accurate current mirror circuits (comprising the transistors T11, T12 and T17, T18 respectively) become operative to supply a current which is superposed on the instantaneously constant current supplied by the more accurate current sources.

It is to be noted that the current gain factors $\beta$ of the transistors T1 and T3 need not necessarily be equal. Moreover, the currents I1 and I2 supplied by the current sources 51 and 53, respectively, need not necessarily be equal. This means that the current I4 can be limited to another value than the value to which the current I5 is limited. However, this does not affect the operation of the entire arrangement.

Moreover, it is to be noted that the supply voltage terminals 34 and 61 may be combined to form a single positive supply voltage terminal and that the supply voltage terminals 35 and 60 may also be combined to form a single negative supply voltage terminal.

It is to be noted also that in the arrangement shown in FIG. 5 the current source 52 or 54 (or if necessary both) may be constructed as a variable current source, to which a control signal can be applied from, for example, the output of a preceding operational amplifier. In the same way as in the circuit shown in FIG. 3, this can be achieved simply by constructing the relevant current source, for example, the current source 54, by means of a transistor whose main current path is arranged between the node K and the supply voltage terminal 35, the base terminal of this transistor then constituting the control terminal of the entire current amplifier stage.

Since it has been assumed that the transistors T5 and T6 receive base current via a current source, it is possible that if the input current increases further a situation occurs in which a maximum current flows through both transistors T5 and T6. Referring to FIG. 3, it will be evident that the current I6 can be equal to at the most $I3 \times \beta(T5)$. Similarly, the current I7 can become equal to a maximum $I8 \times \beta(T6)$. If larger input currents are desired a configuration as illustrated in FIG. 6 may be used.

Figure 6:
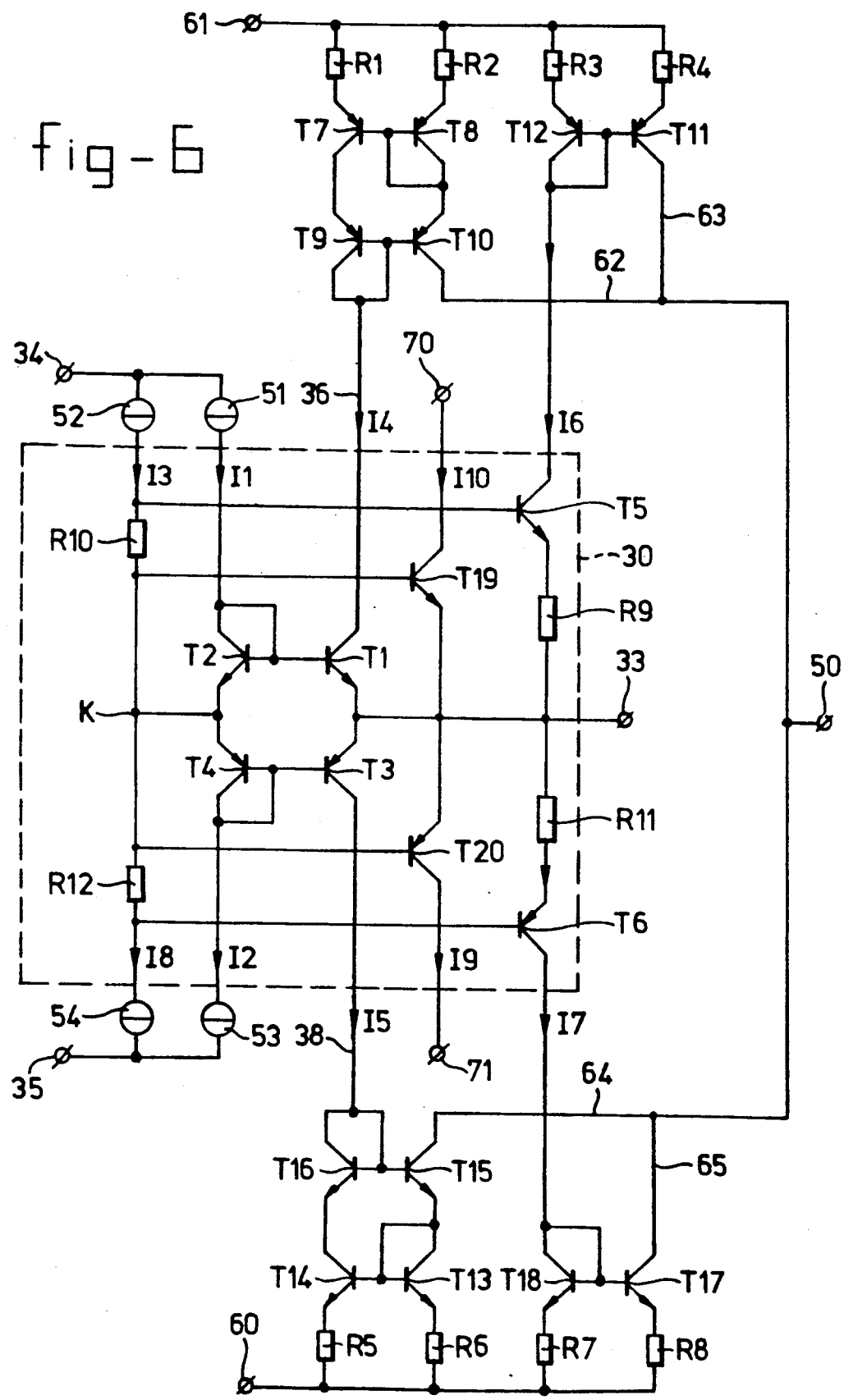
FIG. 6 shows a further development of the circuit shown in FIG. 5.

FIG. 6 shows an arrangement which for the greater part is identical to the arrangement shown in FIG. 5. A first difference between the arrangements shown in FIGS. 5 and 6 can be found around the transistors T5 and T6. A resistor R9 is arranged in the main current path of the transistor T5 and a resistor R10 is arranged between the base of T5 and the node K. Similarly, a resistor R11 is arranged in the main current path of T6 and a resistor R12 is arranged between the base of T6 and the node K. The arrangement shown in FIG. 6 further comprises the transistors T19 and T20. The main current path of T19 is arranged between the input 33 and a positive supply voltage terminal 70. The base of T19 is connected to the node K. The main current path of the transistor T20 is arranged between the input 33 and a negative supply voltage terminal 71, and the base of T20 is connected to the node K.

As a result of the addition of the transistors T19 and T20 and the different arrangement of the transistors T5 and T6, the entire input current path is not divided into two sub-paths as is in the arrangement shown in FIG. 5, but is divided into three sub-paths. In connection therewith reference is made to FIG. 7, which shows a diagram of the various currents in the arrangement shown in FIG. 6.

For a detailed explanation of the operation of the arrangement shown in FIG. 6, it is again assumed that the input current via the input terminal 33 is small, so that only the transistor T1 conducts. When this input current increases, the situation as described above, will be obtained in which the full input current I1, supplied by the current source 51, flows through the base of T1 and the transistor T2 is turned off. At this instant the current source 52 will supply current to the base of T5, which is consequently turned on. The presence of the resistor R10 in conjunction with the resistor R9 ensures that T19 remains cut off. So far the operation of the arrangement shown in FIG. 6 is identical to the operation of the arrangement shown in FIG. 5. The current I6 will flow via the transistor T5 and the current mirror circuit comprising the transistors T11, T12 and the resistors R3, R4 ensures that this current is reproduced and fed to the output 50 and is added to the current supplied by the current mirror circuit comprising the transistors T7, T8, T9, T10 and the resistors R1 and R2.

When the current source 52 reaches the point at which substantially its entire current I3 flows via the base of T5, the voltage drop across R10 will decrease in such a way that the potential on the node K can become positive, enabling T19 to be turned on. In other words, as soon as the current I6 through the transistor T5 is limited to its maximum value a further increase of the current via the input 33 will result in a current through the transistor T19.

Figure 7:
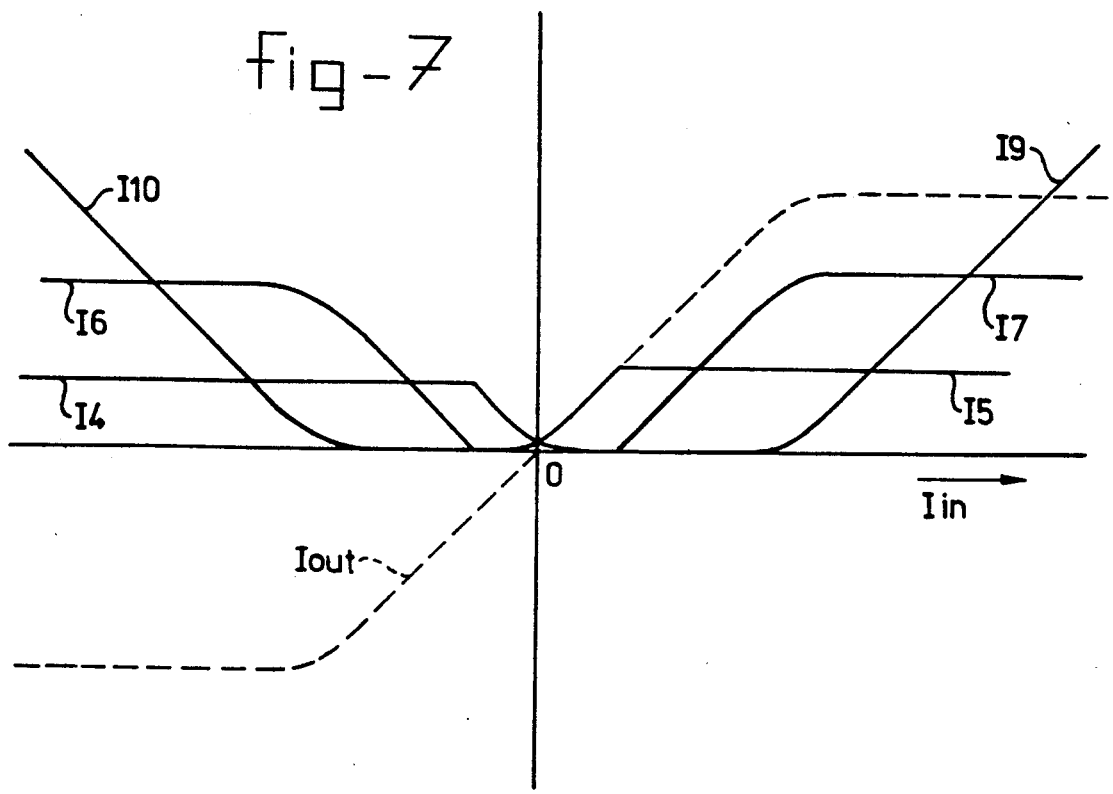
FIG. 7 shows a diagram of some currents appearing in the arrangement shown in FIG. 6.

FIG. 7, in the same way as FIG. 4, shows diagrammatically the various currents. FIG. 7 shows clearly that first of all the current I4 will flow. As soon as the saturation point in this current occurs the current I6 starts to flow and at a specific instant a gradual crossover from the current I6 to the current I10 will occur, such that I6 is limited to a maximum value and I10 can increase further. The increase of I10 is limited only by the current-carrying capacity of the power supply source connected to the terminal 70 and the terminal 71, respectively.

In the arrangement shown in FIG. 6 it is also necessary to construct at least one of the current sources 52 or 54 as a controllable current source if the current amplifier is to be used as an output stage following an operational amplifier.

Figure 8:
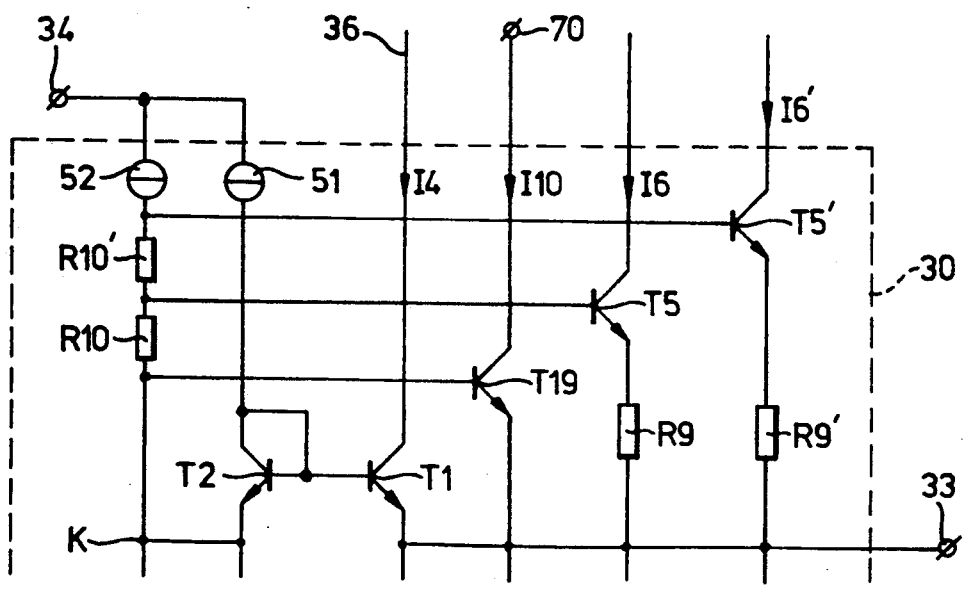
FIG. 8 shows a part of the arrangement to illustrate how current division can be effected in even more steps.

The principle employed in FIG. 6, of adding an additional current switching stage comprising the transistor T5 by means of the resistors R9 and R10, can be extended to a plurality of stages, as is illustrated diagrammatically in FIG. 8. FIG. 8 shows only a part of the entire current amplifier stage. Components corresponding to the components in FIG. 6 are the transistors T1, T2, T5 and T19, the resistors R9 and R10, the current sources 51 and 52, the current input 33, the node K and the supply voltage terminals 34 and 70. As is illustrated in FIG. 8, it is possible by adding a further resistor R10' to connect a further current dividing transistor T5' via a resistor R9'. As the input current through the node 33 gradually increases the current I4 will initially flow via the line 36, in a manner as already described for the preceding embodiments, until the instant at which this current reaches its maximum. The voltage variation on the node K will subsequently cause a current I6' to flow via the transistor T5'. As the current I6' increases the voltage drop across R9' will also increase, resulting in I6' being limited and T5 being gradually driven into conduction, so that the current I6 can flow, and if this current also increases continually the increasing voltage drop across R9 will limit the current I6, finally enabling T19 to be turned on so that the current I10 will flow.

It will be evident that the transistor T5' must be connected to a current mirror circuit, not shown in FIG. 8, which during operation reproduces and feeds the current I6' to the output 50 of the current amplifier.

It will also be obvious that this principle may be applied to further stages T5", T5'" etc. also connected via suitable resistors R10", R10'", R9" and R9'". Although FIG. 8 shows only that part of the arrangement which is connected to the positive supply voltage terminals, it will be evident that similar extensions can also be realised in mirror-inverted form for that part of the circuit which is not shown and which is connected to the negative supply voltage terminals.

Instead of the bipolar transistors shown herein it is also possible to use unipolar MOS transistors, in which case the base, emitter and collector of a bipolar transistor should be replaced by the gate, source and drain of a unipolar transistor.

We claim:

1. A current amplifier arrangement comprising:
   a current-current converter having an input connected to an input of the current amplifier arrangement, a first output, and a power supply input to which a current source is connected, wherein the current-current converter further comprises a first output transistor whose main current path is connected between the input and the first output of the current-current converter and whose base is connected to the power supply input, and a diode-connected driver transistor connected between the base of the first output transistor and a node carrying a reference potential during operation,
   a current mirror circuit having an input connected to the first output of the current-current converter and having an output connected to an output of the current amplifier arrangement,
   wherein the current-current converter further comprises a second output transistor having its main current path coupled between the input and a second output of the current-current converter and having its base connected to said node, the driver transistor being conductive as long as a part of a current supplied by the current source flows through the driver transistor and thereby keeps the second output transistor cut off, and when the full current from the current source flows through the base of the first output transistor the driver transistor is cut-off whereby the second output transistor becomes conductive and supplies a current to the second output of the current-current converter.

2. A current amplifier arrangement as claimed in claim 1, wherein the main current path of the second output transistor is connected via said second output to a further power supply terminal of the current amplifier arrangement.

3. A current amplifier arrangement as claimed in claim 1, wherein the main current path of the second output transistor is connected via said second output to an input of a second current mirror circuit, which second current mirror circuit has an output connected to the output of the current amplifier arrangement.

4. A current amplifier arrangement as claimed in claim 3, wherein the current-current converter comprises one or more further output transistors, each further output transistor having one end of its main current path connected to the input of the current-current converter via a first resistor and having the other end of its main current path connected to an input of a further current mirror circuit, and having its base connected to said node via a second resistor and to a further current source, the resistance values of the associated first and second resistors for each of the further output transistors being selected in such a way that for an increasing input current of the current amplifier arrangement one of the further output transistors can be turned on after cut-off of said driver transistor and that when the maximum current through said output transistor is reached a further output transistor can become conductive.

5. A balanced current amplifier arrangement comprising two complementary current amplifier arrangements each as claimed in claim 1, the outputs, the inputs and the nodes being interconnected and the current amplifier arrangements comprising power supply terminals for the application of supply voltages of opposite polarity.

6. A current amplifier arrangement as claimed in claim 2, wherein the current-current converter comprises one or more further output transistors, each further output transistor having one end of its main current path connected to the input of the current-current converter via a first resistor and having the other end of its main current path connected to an input of a further current mirror circuit, and having its base connected to said node via a second resistor and to a further current source, the resistance values of the associated first and second resistors for each of the further output transistors being selected in such a way that for an increasing input current of the current amplifier arrangement one of the further output transistors can be turned on after cut-off of said driver transistor and that when the maximum current through said output transistor is reached a further output transistor can become conductive.

7. A current amplifier circuit comprising:
   a current/current converter having an input coupled to an input of the current amplifier circuit, current output means, and power supply input means,
   current mirror circuit means having input means connected to the current output means of the current/current converter and having output means coupled to an output of the current amplifier circuit,
   and wherein the current/current converter further comprises;
   a first output transistor coupled between the input and the output means of the current/current converter and having a control electrode coupled to said power supply input means via a first current source,
   a diode-connected driver transistor coupled between said first output transistor control electrode and a reference voltage node,
   a second output transistor coupled between the input and the output means of the current/current converter and having a control electrode coupled to said node and to said power supply input means via a second current source, and
   wherein the driver transistor conducts a part of the current supplied by the first current source so long as an input current at the converter input is below a given current threshold level, whereby the driver transistor holds the second output transistor in cut-off, and when said input current reaches said given input current threshold level, the driver transistor is cut-off whereby the second output transistor becomes conductive and supplies a further current to the current converter output means and hence to the current amplifier circuit output via the current mirror circuit means.

8. A current amplifier circuit as claimed in claim 7 wherein said current mirror circuit means comprises first and second current mirror circuits each having an input terminal and an output terminal, and said current converter output means includes first and second output terminals connected to the respective inputs of the first and second current mirror circuits and to respective output electrodes of the first and second output transistors, and wherein the output terminals of the first and second current mirror circuits are connected to said output of the current amplifier circuit.

9. A bipolarity current amplifier circuit as claimed in claim 8 wherein:
   said power supply input means include first and second power supply terminals for the supply of a positive and a negative supply voltage, respectively, and
   wherein the control electrodes of the first and second output transistors are coupled to said first power supply terminal, said bipolarity current amplifier circuit further comprising:
   a third output transistor coupled between the input and the output means of the current/current converter and having a control electrode coupled to said second power supply terminal of the power supply input means via a third current source,
   a second diode-connected driver transistor coupled between said third output transistor control electrode and the reference voltage node,
   a fourth output transistor coupled between the input and the output means of the current/current converter and having a control electrode coupled to said node and to said second power supply terminal via a fourth current source, and wherein
   the second driver transistor conducts a part of the current supplied by the third current source so long as an input current at the converter input is below a given current threshold level, whereby the second driver transistor holds the fourth output transistor in cut-off, and when said input current reaches said input current threshold level, the second driver transistor is cut-off whereby the fourth output transistor becomes conductive and supplies a further current to the current converter output means and hence to the current amplifier circuit output via the current mirror circuit means.

10. A bipolarity current amplifier circuit as claimed in claim 9 wherein:
    said current mirror circuit means comprises first and second current mirror circuits each having an input terminal and an output terminal, and said current converter output means includes first and second output terminals connected to respective input terminals of the first and second current mirror circuits and to respective output electrodes of the first and second output transistors, wherein
    said current mirror circuit means further comprises third and fourth current mirror circuits each having an input terminal and an output terminal, and said current converter output means further includes third and fourth output terminals connected to respective input terminals of the third and fourth current mirror circuits and to respective output electrodes of the third and fourth output transistors, and wherein
    the output terminals of the first, second, third and fourth current mirror circuits are connected to said output of the current amplifier circuit.

11. A current amplifier circuit as claimed in claim 7 wherein:
    the current/current converter further comprises a third output transistor connected in series with a first resistor between said current/current converter input and current output means, and
    means connecting a control electrode of the third output transistor to said node via a second resistor and to a current source such that the third output transistor is cut-off at least for input currents below said given current threshold level,
    whereby when the input current reaches a second given current threshold level, the third output transistor becomes conductive to supply a further current to the output of the current amplifier circuit via said current converter output means and said current mirror circuit means.

12. A current amplifier circuit as claimed in claim 11 wherein said current mirror circuit means comprises first, second and third current mirror circuits each having an input terminal and an output terminal, and said current converter output means includes first, second and third output terminals connected to respective input terminals of the first, second and third current mirror circuits and to respective output electrodes of the first, second and third output transistors, and wherein the output terminals of the first, second and third current mirror circuits are connected to said output of the current amplifier circuit.

13. A current amplifier circuit as claimed in claim 7 wherein at least one of said current sources comprises a variable current source having a control terminal for adjusting the current level thereof.

14. A current amplifier circuit as claimed in claim 11 further comprising a further transistor coupled between said current converter input and a supply voltage terminal and with its control electrode coupled to said node.

* * * * *